United States Patent
Woo et al.

(10) Patent No.: US 9,268,531 B1
(45) Date of Patent: Feb. 23, 2016

(54) NONVOLATILE MEMORY SYSTEM, STORAGE DEVICE AND METHOD FOR OPERATING NONVOLATILE MEMORY DEVICE

(71) Applicant: SAMSUNG ELECTRONICS CO., LTD., Suwon-Si, Gyeonggi-Do (KR)

(72) Inventors: Seong-Hoon Woo, Gyeonggi-do (KR); Hak-Sun Kim, Gyeonggi-do (KR); Seong-Hyeog Choi, Gyeonggi-do (KR); Jun-Jin Kong, Gyeonggi-do (KR); Hong-Rak Son, Gyeonggi-do (KR); Soon-Jae Won, Gyeonggi-do (KR); Jung-Soo Chung, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/722,751

(22) Filed: May 27, 2015

(30) Foreign Application Priority Data

Oct. 10, 2014 (KR) .................. 10-2014-0136776

(51) Int. Cl.
*G06F 7/58* (2006.01)
*G11C 16/04* (2006.01)

(52) U.S. Cl.
CPC .............. *G06F 7/58* (2013.01); *G11C 16/0466* (2013.01)

(58) Field of Classification Search
CPC ............................. G06F 7/58; G11C 16/0466
USPC ........................................................ 708/254
See application file for complete search history.

(56) References Cited

U.S. PATENT DOCUMENTS

| | | | |
|---|---|---|---|
| 7,047,262 B2 | 5/2006 | Hars | |
| 8,127,200 B2 | 2/2012 | Sharon et al. | |
| 8,131,920 B2 | 3/2012 | Hattori et al. | |
| 8,281,064 B2 | 10/2012 | Oh et al. | |
| 8,352,808 B2 | 1/2013 | Kim et al. | |
| 8,370,561 B2 | 2/2013 | Sharon et al. | |
| 8,595,422 B2 | 11/2013 | Ruby et al. | |
| 8,612,667 B2 | 12/2013 | Lin et al. | |
| 8,700,974 B2 | 4/2014 | Chung et al. | |
| 8,719,491 B2 | 5/2014 | Chen et al. | |
| 8,730,724 B2 | 5/2014 | Kuo et al. | |
| 8,737,125 B2 | 5/2014 | Pan et al. | |
| 2008/0082825 A1* | 4/2008 | Mizushima et al. | 713/172 |
| 2010/0259983 A1* | 10/2010 | Yoon | 365/185.12 |
| 2011/0119432 A1* | 5/2011 | Yoon | 711/103 |
| 2012/0005409 A1 | 1/2012 | Yang | |
| 2012/0166708 A1 | 6/2012 | Chung et al. | |
| 2012/0287719 A1* | 11/2012 | Mun et al. | 365/185.18 |
| 2012/0290783 A1 | 11/2012 | Chung et al. | |

\* cited by examiner

*Primary Examiner* — Tan V. Mai
(74) *Attorney, Agent, or Firm* — F. Chau & Associates, LLC

(57) ABSTRACT

A nonvolatile memory device includes a data generating unit for generating a first reference value randomly or pseudo-randomly according to a first program request to program data in a memory cell, a seed selecting unit for selecting at least one of a plurality of seeds using the first reference value, and a randomizer for generating randomized data by using the selected seed. The data generating unit regenerates the first reference value as a second reference value different from the first reference value when a second program request is made, and the seed selecting unit selects another seed using the second reference value.

30 Claims, 19 Drawing Sheets

FIG.7

SEED TABLE

| TABLE INDEX | 300a<br>0 | 300b<br>1 | 300c<br>2 | 300d<br>3 |
|---|---|---|---|---|
| PG 0 | 0×2425 | 0×F334 | 0×B23C | 0×5282 |
| PG 1 | 0×5211 | 0×23AC | 0×DE25 | 0×122C |
| ⋮ | ⋮ | ⋮ | ⋮ | ⋮ |

3000

NONVOLATILE MEMORY SYSTEM, STORAGE DEVICE AND METHOD FOR OPERATING NONVOLATILE MEMORY DEVICE

CROSS-REFERENCE TO RELATED APPLICATION

This application claims priority under 35 U.S.C. §119 to Korean Patent Application No. 10-2014-0136776, filed on Oct. 10, 2014 in the Korean Intellectual Property Office, the disclosure of which is incorporated by reference herein in its entirety.

TECHNICAL FIELD

The present inventive concept relates to a nonvolatile memory system, a storage device, and a method for operating a nonvolatile memory device.

DESCRIPTION OF THE RELATED ART

A semiconductor memory device is a storage device that is implemented using a semiconductor such as silicon (Si), germanium (Ge), gallium arsenide (GaAs), and indium phosphide (InP), for example. The semiconductor memory device is classified as a volatile memory device and a nonvolatile memory device, for example.

The volatile memory device is a memory device in which stored data is lost when power is gone. The volatile memory device includes a Static Random Access Memory (SRAM), a Dynamic RAM (DRAM), and a Synchronous DRAM (SDRAM), for example. The nonvolatile memory device is a memory device in which stored data is maintained in the absence of power. The nonvolatile memory device includes a flash memory device, a Read Only Memory (ROM), a Programmable ROM (PROM), an Electrically Programmable ROM (EPROM), an Electrically Erasable and Programmable ROM (EEPROM), and a resistive memory (e.g., a Phase-change RAM (PRAM), a Ferroelectric RAM (FRAM), and a Resistive RAM (RRAM)), for example.

SUMMARY

An exemplary embodiment of the present inventive concept provides a nonvolatile memory system, which can increase seed randomness to increase data randomness.

An exemplary embodiment of the present inventive concept provides a storage device, which can increase seed randomness to increase data randomness.

An exemplary embodiment of the present inventive concept provides a method for operating a nonvolatile memory device, which can increase seed randomness to increase data randomness.

In an exemplary embodiment of the present inventive concept, there is provided a memory system comprising a vertical NAND memory, comprising a plurality of memory blocks, each of the memory blocks comprises a plurality of memory cells, wherein the memory blocks have a three-dimensional (3D) structure in which the memory cells are stacked on a substrate in a vertical direction, and a memory controller coupled to the vertical NAND memory, comprising a data generating unit for generating a first reference value randomly or pseudo-randomly according to a first program request to program data in the memory cell, a seed selecting unit for selecting at least one of a plurality of seeds using the first reference value, and a randomizer for generating randomized data by using the selected seed, wherein the data generating unit generates a second reference value different from the first reference value when a second program request is made, and the seed selecting unit selects another seed using the second reference value.

The randomizer randomizes the data using the another seed when the second program request is made.

The data generating unit comprises a timer, a True Random Number Generator (TRNG), a counter, or a shift register.

The data generating unit may generate the first reference value using the timer, for the first reference value to have randomness based on a real time clock (RTC) of the memory system in which the vertical NAND memory is disposed.

The plurality of seeds are stored in a plurality of seed tables, and the seed selecting unit selects the seed table that corresponds to the first reference value among the plurality of seed tables, and selects the seed from the selected seed table.

Each of the plurality of seed tables includes table index values identifying the respective seed tables, and the first reference value corresponds to one of the table index values.

The plurality of seeds are calculated from a plurality of polynomials, and the seed selecting unit selects the polynomial that corresponds to the first reference value among the plurality of polynomials, and calculates the seed using the selected polynomial.

The plurality of seeds are respectively calculated by a plurality of shift registers, and the seed selecting unit selects the shift register that corresponds to the first reference value among the plurality of shift registers, and calculates the seed using the selected shift register.

The selected shift register comprises a first output tap and a second output tap, and the seed selecting unit calculates the seed by combining an output value of the first output tap with an output value of the second output tap of the selected shift register.

The randomized data is programmed in the memory cell together with the first reference value or a value that corresponds to the first reference value.

The seed generating unit generates two or more seeds using the first reference value, and the randomizer generates randomized data by using the two or more seeds.

The seed generating unit comprises: a seed candidate generator for generating a seed candidate group including a plurality of seed candidates using the first reference value; and a seed selector for selecting two or more seeds that satisfy a predetermined rule from the seed candidate group generated by the seed candidate generator.

The vertical NAND memory comprises a plurality of NAND strings disposed in a vertical direction, and each of the NAND strings are provided between a bit line (BL) and a common source line (CSL) which are formed in horizontal direction, wherein each of the NAND strings comprises a gate selection transistor (GST), a string selection transistor (SST) and a plurality of memory cells between the GST and the SST, and wherein the vertical NAND memory further comprises a string selection line (SSL) connected to the SST, a plurality of word lines (WL) connected to the plurality of memory cells, and a ground selection line (GSL) connected to the GST.

The memory cell includes Charge Trap Flash (CTF) type memory cell.

In an exemplary embodiment of the present inventive concept, there is provided a storage device comprising a flash memory comprising of a plurality of memory cells, and a storage device controller coupled to the flash memory comprising a data generating unit for generating a reference value randomly or pseudo-randomly each time a program request to program data in a memory cell is made, and a randomizer for selecting a seed that corresponds to the reference value among pre-stored seeds, and generating randomized data that is obtained by randomizing the data each time the request is made, wherein the randomized data is programmed in the memory cell, and the data generating unit regenerates the reference value as a different value each time the request is made.

The storage device includes a Solid State Drive (SSD).

The data generating unit generates the reference value using a value that is acquired from a timer, a True Random Number Generator (TRNG), a counter, or a shift register.

The storage device is electrically connected to a volatile memory device that is arranged on an outside of the storage device, and an initial value of the counter is set using an initial value that is stored in the volatile memory device during power-on of the volatile memory device.

The pre-stored seeds are stored in a ROM (Read Only Memory) that is electrically connected to the storage device.

In an exemplary embodiment of the present inventive concept, there is provided a nonvolatile memory system comprising a nonvolatile memory comprising a plurality of memory cells, and a memory controller coupled to the nonvolatile memory comprising a data generating unit for generating a first reference value randomly or pseudo-randomly according to a first program request to program data in a memory cell, a seed selecting unit for selecting at least one of a plurality of seeds using the first reference value, and a randomizer for generating randomized data by using the selected seed, wherein the data generating unit generates a second reference value different from the first reference value when a second program request is made, and the seed selecting unit selects another seed using the second reference value.

The randomizer randomizes the data using the another seed when the second program request is made.

The plurality of seeds are stored in a plurality of seed tables, and the seed selecting unit selects the seed table that corresponds to the first reference value among the plurality of seed tables, and selects the seed from the selected seed table.

The plurality of seeds are calculated from a plurality of polynomials, and the seed selecting unit selects the polynomial that corresponds to the first reference value among the plurality of polynomials, and calculates the seed using the selected polynomial.

The plurality of seeds are respectively calculated by a plurality of shift registers, and the seed selecting unit selects the shift register that corresponds to the first reference value among the plurality of shift registers, and calculates the seed using the selected shift register.

The randomized data is programmed in the memory cell together with the first reference value or a value that corresponds to the first reference value.

The seed generating unit generates two or more seeds using the first reference value, and the randomizer generates randomized data by using the two or more seeds.

In an exemplary embodiment of the present inventive concept, there is provided a method of operating a nonvolatile memory device comprising generating a first reference value randomly or pseudo-randomly according to a first program request to program data in a memory cell, selecting at least one of a plurality of seeds using the first reference value, generating randomized data by using the selected seed, generating a second reference value different from the first reference value when a second program request is made, and selecting another seed using the second reference value.

The selecting at least one of a plurality of seeds using the first reference value comprises selecting a seed that corresponds to the reference value among pre-stored seed values.

The selecting at least one of a plurality of seeds using the first reference value comprises generating a plurality of seed candidates using the reference value, and selecting two or more seeds that satisfy a predetermined rule from the plurality of seed candidates.

The method further comprises programming the first reference value or the selected seed in the memory cell together with the random data.

BRIEF DESCRIPTION OF THE DRAWINGS

The above and other features of the present inventive concept will be more apparent by describing in detail exemplary embodiments thereof with reference to the accompanying drawings, in which:

FIG. 7 is a diagram of a seed table used in FIG. 6, according to an exemplary embodiment of the present inventive concept;

DETAILED DESCRIPTION OF THE EMBODIMENTS

Figure 1:
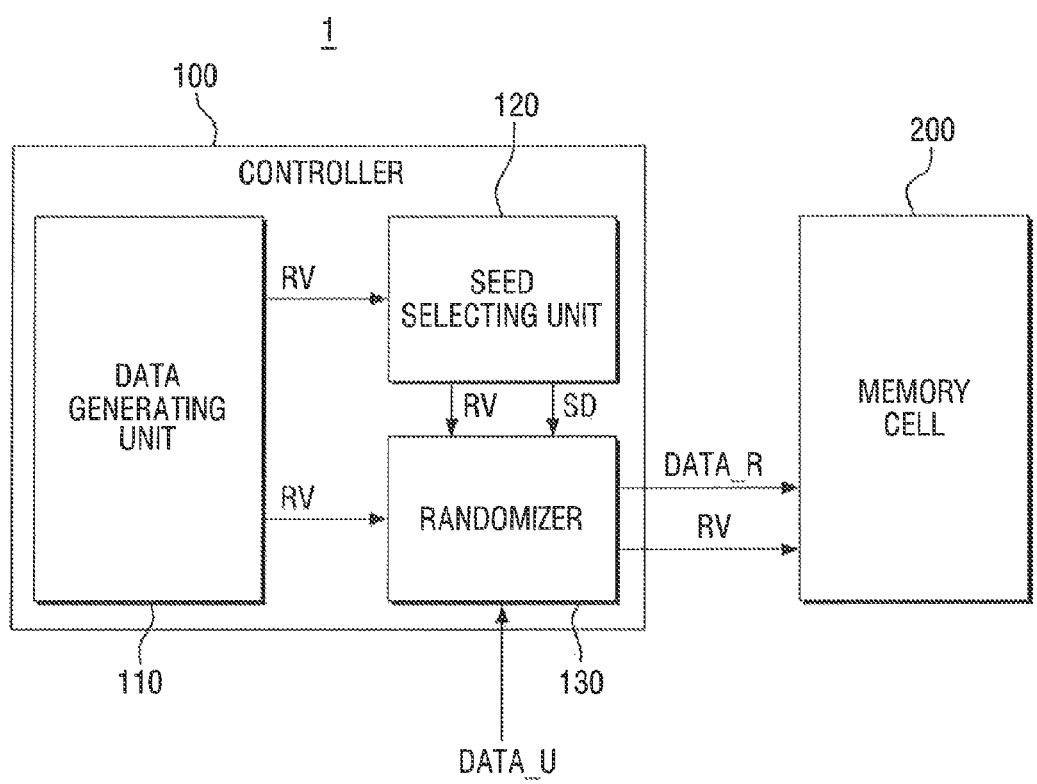
FIG. 1 is a block diagram of a nonvolatile memory device according to an exemplary embodiment of the present inventive concept.

Exemplary embodiments of the present inventive concept will now be described in detail with reference to the accompanying drawings. The present inventive concept, however, may be embodied in various different forms, and should not be construed as being limited only to the illustrated embodiments. Unless otherwise noted, like reference numerals denote like elements throughout the attached drawings and written description, and thus descriptions will not be repeated. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram of a nonvolatile memory device according to an exemplary embodiment of the present inventive concept.

Referring to FIG. 1, a nonvolatile memory device 1 according to an exemplary embodiment of the present inventive concept includes a controller 100 and a memory cell 200.

The nonvolatile memory device 1 may perform write, read, and erase operations with respect to the memory cell 200 under the control of the controller 100. The nonvolatile memory device 1 may include a flash memory, an Electrically Erasable and Programmable Read-Only Memory (EEPROM), a Ferroelectric Random Access Memory (FRAM), a Phase change Random Access Memory (PRAM), and a Magneto resistive Random Access Memory (MRAM), but is not limited thereto. In exemplary embodiments of the present inventive concept, the nonvolatile memory device 1 may be a NAND flash memory device. In this case, the nonvolatile memory device 1 may include a plurality of planes PL1 to PLn (where, n is a natural number). Each of the planes PL1 to PLn includes a plurality of blocks BLK1 to BLKm (where, m is a natural number), and each of the blocks BLK1 to BLKm includes a plurality of word lines WL1 to WLk (where, k is a natural number). Here, the blocks BLK1 to BLKm may correspond to a unit for performing an erase command, in other words, a unit in which the erase operations are simultaneously performed. The word lines may correspond to a unit for performing a program and a read command, in other words, a unit in which the program and the read commands are simultaneously performed. In addition, the plurality of blocks BLK1 to BLKm may include a three-dimensional (3D) structure in which memory cells are laminated (e.g., stacked) on a substrate in a vertical direction.

In the nonvolatile memory device 1 according to an exemplary embodiment of the present inventive concept, the controller 100 includes a data generating unit 110, a seed selecting unit 120, and a randomizer 130. Each of the data generating unit 110, the seed selecting unit 120, and the randomizer 130 may be a circuit. In exemplary embodiments of the present inventive concept, the nonvolatile memory device 1 may be a storage device, for example, a Solid State Disk (SSD). In this case, the storage device may include a flash memory having a plurality of memory cells, and a storage controller corresponding to the controller 100 and coupled to the flash memory.

The data generating unit 110 generates a reference value RV randomly or pseudo-randomly according to a program request for programming data DATA_U in the memory cell 200. Here, the reference value RV may be a value which is used for selecting one of a plurality of pre-generated seeds as a seed SD which is used for the randomizer 130 to randomize data. This data randomization process will be described later. In exemplary embodiments of the present inventive concept, the data generating unit 110 may regenerate the reference value RV having randomness when the program request is made, and the regenerated reference value RV may be different from the previously generated reference value RV. Exemplary embodiments of the inventive concept, in which the data generating unit 110 generates the reference value RV randomly or pseudo-randomly, will be described later with reference to FIGS. 2 to 5.

To randomize data DATA_U may mean to convert data having a distinct tendency into data having no tendency or considerably low tendency to prevent, for example, adjacent memory cells from being successively programmed. By programming data DATA_R that is randomized in the memory cell 200, errors may not occur between adjacent memory cells. As an example, if an erase operation is successively performed with respect to adjacent cells in a Charge Trap Flash (CTF) type memory, a deep erase phenomenon in that charge spreading of program states accelerates may occur. If randomness is introduced to the data to be programmed in the memory cell 200, such a phenomenon can be prevented from occurring or the occurrence of this phenomenon can be lowered, and thus, reliability of the nonvolatile memory device 1 can be increased. In particular, according to exemplary embodiments of the present inventive concept, since the seed SD is selected using a specific value (e.g., a reference value) that is changed randomly in time, the seed SD itself has randomness over time, and thus, the randomness of the data DATA_R, which has passed through the randomizer 130 that uses the seed SD, becomes further increased.

The seed selecting unit 120 selects at least one of the plurality of seeds SD using the reference value RV that is generated by the data generating unit 110. Here, the plurality of seeds SD may be pre-generated and may be stored in another memory space (e.g., a Read Only Memory (ROM)) or a storage space that is electrically connected to the nonvolatile memory device 1. The reference value RV that is generated by the data generating unit 110 may have a corresponding relationship with a part of the plurality of seeds SD. For example, the data generating unit 110 generates a first reference value according to a program request for first data, and the seed selecting unit 120 selects a first seed that corresponds to the first reference value among the plurality of seeds SD. Thereafter, if a program request for second data is generated, the data generating unit 110 generates a second reference value that is different from the first reference value randomly or pseudo-randomly, and the seed selecting unit 120 selects a second seed that corresponds to the second reference value among the plurality of seeds SD. In exemplary embodiments of the present inventive concept, the seed selecting unit 120 may reselect the seed SD using the reference value RV that is regenerated by the data generating unit 110 when the program request is generated, and the reselected seed SD may be different from the previously selected seed SD.

The randomizer 130 randomizes the data using the seed SD that is selected by the seed selecting unit 120 and generates randomized data DATA_R. For example, the randomizer 130 may generate the randomized data DATA_R by combining (e.g., XOR-gating) the program-requested data DATA_U with the seed SD that is selected by the seed selecting unit 120. As described above, the randomized data DATA_R is programmed in the memory cell 200. In exemplary embodiments of the present inventive concept, the randomizer 130 may randomize the data DATA_U using the seed SD that is reselected by the seed selecting unit 120 when the program request is made, and thus, the randomness of the data DATA_R may be temporarily increased.

The data DATA_R that is randomized by the randomizer 130 may be programmed in the memory cell 200 together with the reference value RV or a certain value (e.g., another value that is in a one-to-one correspondence to the reference value RV) that corresponds to the reference value RV. In other words, the randomizer 130 transmits the randomized data DATA_R and the reference value RV or a value that corresponds to the reference value RV to the memory cell 200. As shown in FIG. 1, the randomizer 130 may receive the reference value RV that is transferred from the data generating unit 110 or the seed selecting unit 120. Thereafter, the randomized data DATA_R that is programmed in the memory cell 200 may be derandomized using the reference value RV or a value that corresponds to the reference value RV that is programmed in the memory cell 200.

In exemplary embodiments of the present inventive concept, the data generating unit 110 may include at least one of a timer, a True Random Number Generator (TRNG), a counter, and a shift register to generate the reference value randomly or pseudo-randomly according to the program request. Hereinafter, this will be described with reference to FIGS. 2 to 5.

Figure 2:
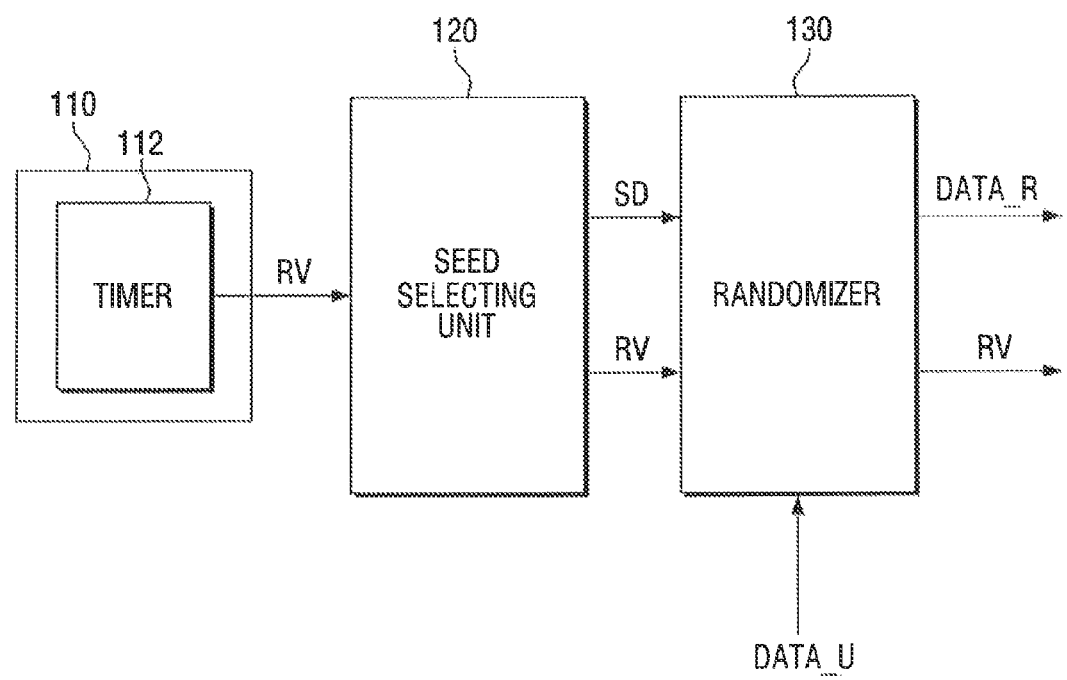
FIG. 2 is a block diagram of a data generating unit of a nonvolatile memory device according to an exemplary embodiment of the present inventive concept.

FIG. 2 is a block diagram of a data generating unit of a nonvolatile memory device according to an exemplary embodiment of the present inventive concept.

Referring to FIG. 2, the data generating unit 110 according to an exemplary embodiment of the present inventive concept may include a timer 112 and may generate the reference value RV using the timer 112. For example, the timer 112 may generate the reference value RV having randomness based on a real time clock (RTC) of a system in which a nonvolatile memory is disposed. The data generating unit 110 may transfer the reference value RV that is generated using the timer 112 to the seed selecting unit 120. Here, the reference value RV may be the value that is acquired from the timer 112 or a value that is obtained by converting the value acquired from the timer 112 using, for example, a specific calculation equation. The seed selecting unit 120 may select at least one of the plurality of pre-generated seeds using the reference value RV that is transferred from the data generating unit 110. As described above, if the seed SD is selected in consideration of the reference value RV having randomness according to time, the seed SD also has the randomness according to time, and thus, the randomness of the data that is randomized by the randomizer 130 using the seed SD is further increased.

FIG. 2 illustrates that the timer 112 is arranged inside the data generating unit 110, but is not limited thereto. In other words, in exemplary embodiments of the present inventive concept, the timer 112 may be arranged outside the data generating unit 110, and the data generating unit 110 may generate the reference value RV using the value that is acquired from the timer 112.

Figure 3:
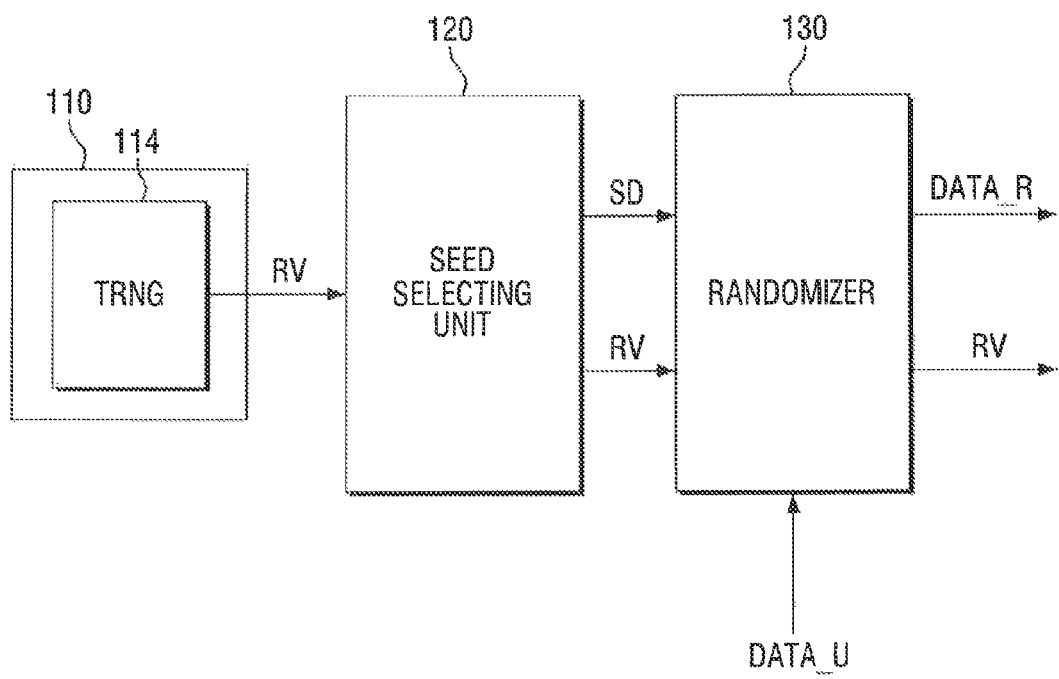
FIG. 3 is a block diagram of a data generating unit of a nonvolatile memory device according to an exemplary embodiment of the present inventive concept.

FIG. 3 is a block diagram of a data generating unit of a nonvolatile memory device according to an exemplary embodiment of the present inventive concept.

Referring to FIG. 3, the data generating unit 110 according to an exemplary embodiment of the present inventive concept may include a TRNG 114 and may generate the reference value RV having randomness using the TRNG 114. For example, the value at a certain time point, which can be acquired from the timer 112 as described above, is not a true random number, but is a pseudo-random number. In the embodiment illustrated in FIG. 3, to further increase the randomness of the data that is programmed in the memory cell 200, the reference value RV may be generated using the TRNG 114 that generates the true random number. The data generating unit 110 may transfer the reference value RV that is generated using the TRNG 114 to the seed selecting unit 120. Here, the reference value RV may be the value that is acquired from the TRNG 114 or a value that is obtained by converting the value acquired from the TRNG 114 using, for example, a specific calculation equation. The seed selecting unit 120 may select at least one of the plurality of pre-generated seeds using the reference value RV that is transferred from the data generating unit 110. As described above, if the seed SD is selected in consideration of the reference value RV having randomness according to time, the seed SD also has the randomness according to time, and thus, the randomness of the data that is randomized by the randomizer 130 using the seed SD is further increased.

FIG. 3 illustrates that the TRNG 114 is arranged inside the data generating unit 110, but is not limited thereto. In other words, in exemplary embodiments of the present inventive concept, the TRNG 114 may be arranged outside the data generating unit 110, and the data generating unit 110 may generate the reference value RV using the value that is acquired from the TRNG 114.

Figure 4:
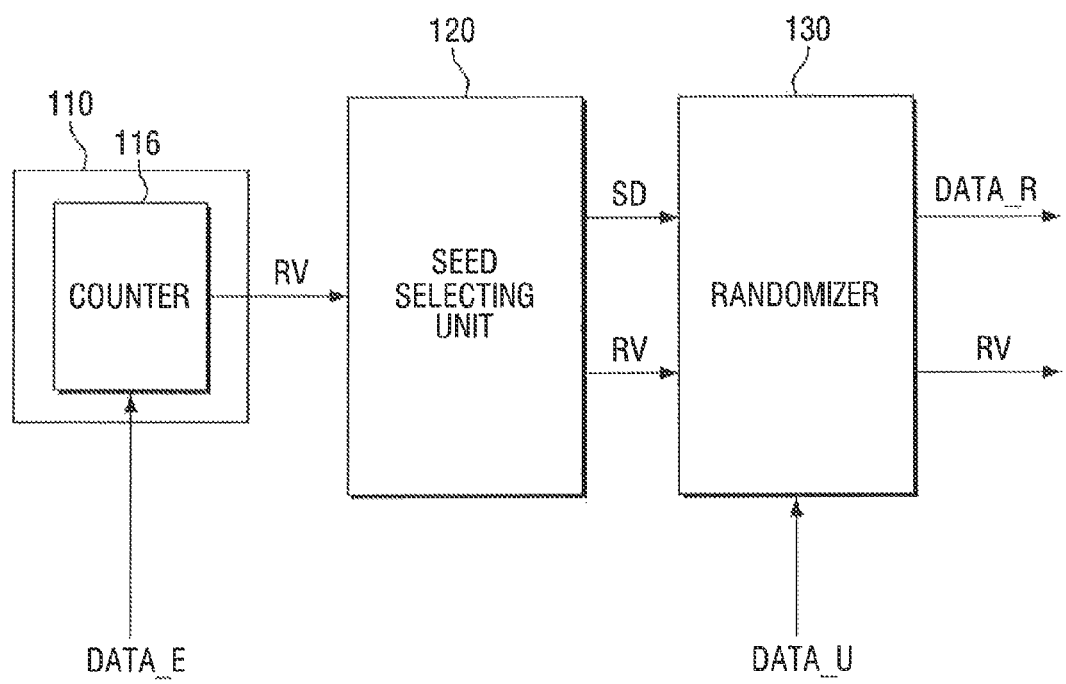
FIG. 4 is a block diagram of a data generating unit of a nonvolatile memory device according to an exemplary embodiment of the present inventive concept.
Figure 5:
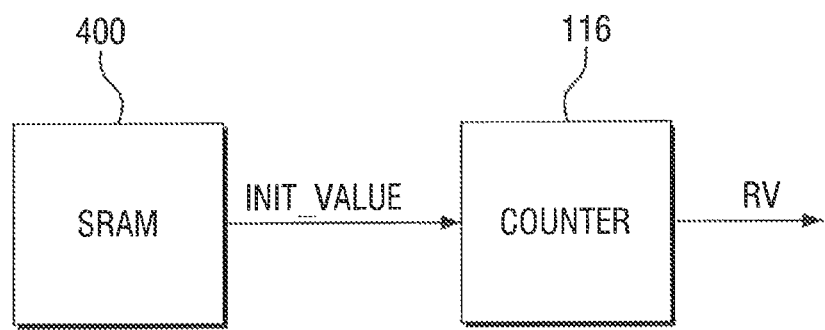
FIG. 5 is a block diagram of a counter illustrated in FIG. 4 according to an exemplary embodiment of the present inventive concept.

FIG. 4 is a block diagram of a data generating unit of a nonvolatile memory device according to an exemplary embodiment of the present inventive concept, and FIG. 5 is a block diagram of a counter illustrated in FIG. 4 according to an exemplary embodiment of the present inventive concept.

Referring to FIG. 4, the data generating unit 110 according to an exemplary embodiment of the present inventive concept may include a counter 116 and may generate the reference value RV having randomness using the counter 116. For example, the counter 116 may have a status value of a specific region of a system in which a nonvolatile memory is disposed as an initial value, and may operate to count the number of times a specific event occurs when the specific event occurs. However, the counter 116 is not limited thereto.

In exemplary embodiments of the present inventive concept, the counter 116 may receive an initial value DATA_E that is input from an outside when the counter 116 starts counting. For example, referring to FIG. 5, the nonvolatile memory device that includes the counter 116 may be electrically connected to a nonvolatile memory device 400 arranged outside the nonvolatile memory device. In exemplary embodiments of the present inventive concept, the nonvolatile memory device 400 may be a Static Random Access Memory (SRAM), but is not limited thereto. Memory cells of the nonvolatile memory device 400 may have specific values during power-on of the nonvolatile memory device 400. Such values may be garbage data. The initial value of the counter 116 may be set using the initial value INIT_VALUE that is stored in the nonvolatile memory device 400 during the power-on of the nonvolatile memory device 400.

The data generating unit 110 may transfer the reference value RV that is generated using the counter 116 to the seed selecting unit 120. Here, the reference value RV may be the value that is acquired from the counter 116 or a value that is obtained by converting the value acquired from the counter 116 using, for example, a specific calculation equation. The seed selecting unit 120 may select at least one of the plurality of pre-generated seeds using the reference value RV that is transferred from the data generating unit 110. As described above, if the seed SD is selected in consideration of the reference value RV having randomness according to time, the seed SD also has the randomness according to time, and thus, the randomness of the data that is randomized by the randomizer 130 using the seed SD is further increased.

FIG. 4 illustrates that the counter 116 is arranged inside the data generating unit 110, but is not limited thereto. In other words, in exemplary embodiments of the present inventive concept, the counter 116 may be arranged outside the data generating unit 110, and the data generating unit 110 may generate the reference value RV using the value that is acquired from the counter 116.

Figure 6:
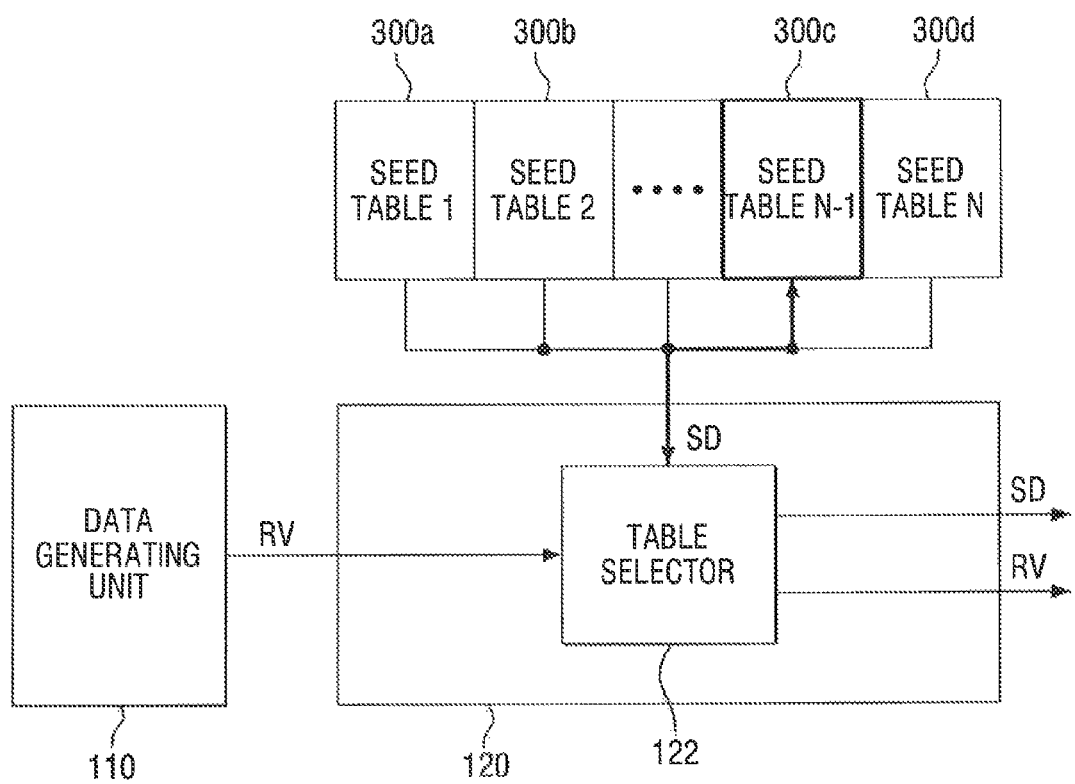
FIG. 6 is a block diagram of a nonvolatile memory device that selects a seed according to an exemplary embodiment of the present inventive concept.

FIG. 6 is a block diagram of a nonvolatile memory device that selects a seed according to an exemplary embodiment of the present inventive concept, and FIG. 7 is a diagram of a seed table used in FIG. 6, according to an exemplary embodiment of the present inventive concept.

Referring to FIG. 6, the seed selecting unit 120 selects at least one of the plurality of seeds SD that are pre-stored in the form of a seed table using the reference value RV that is generated by the data generating unit 110.

The plurality of seeds SD may be pre-stored in a plurality of seed tables 300a to 300d. Referring to FIG. 7, each of the seed tables 300a to 300d includes table index values for identifying the respective seed tables (see "TABLE INDEX" in FIG. 7). Further, each of the seed tables 300a to 300d includes one or more seed values that are pre-calculated for each page of the nonvolatile memory device. For example, referring to FIG. 7, the seed table 300a, of which the table index value is "0", stores "0x2425" as a seed value that corresponds to page 0 PG0, and the seed table 300b, of which the table index value is "1", stores "0x23AC" as a seed value that corresponds to page 1 PG1. The structure of the seed tables 300a to 300d is not limited thereto. In addition, in exemplary embodiments of the present inventive concept, the plurality of seed tables 300a to 300d may be stored in a Read Only Memory (ROM) that is electrically connected to the nonvolatile memory device, but is not limited thereto.

The seed selecting unit 120 may include a table selector 122 for selecting a seed table that corresponds to the reference value RV that is generated by the data generating unit 110 among the plurality of seed tables 300a to 300d. For example, the reference value RV may correspond to any one of table index values for identifying the seed tables as described above. The table selector 122 may select the seed table (e.g., seed table 300c of FIG. 6) that corresponds to the reference value RV among the plurality of the seed tables 300a to 300d, and may select the seed SD that is stored in the selected seed table. This way, the selected seed SD may be transferred to the randomizer 130 and may be used to randomize the data to be programmed in the memory cell 200.

Figure 8:
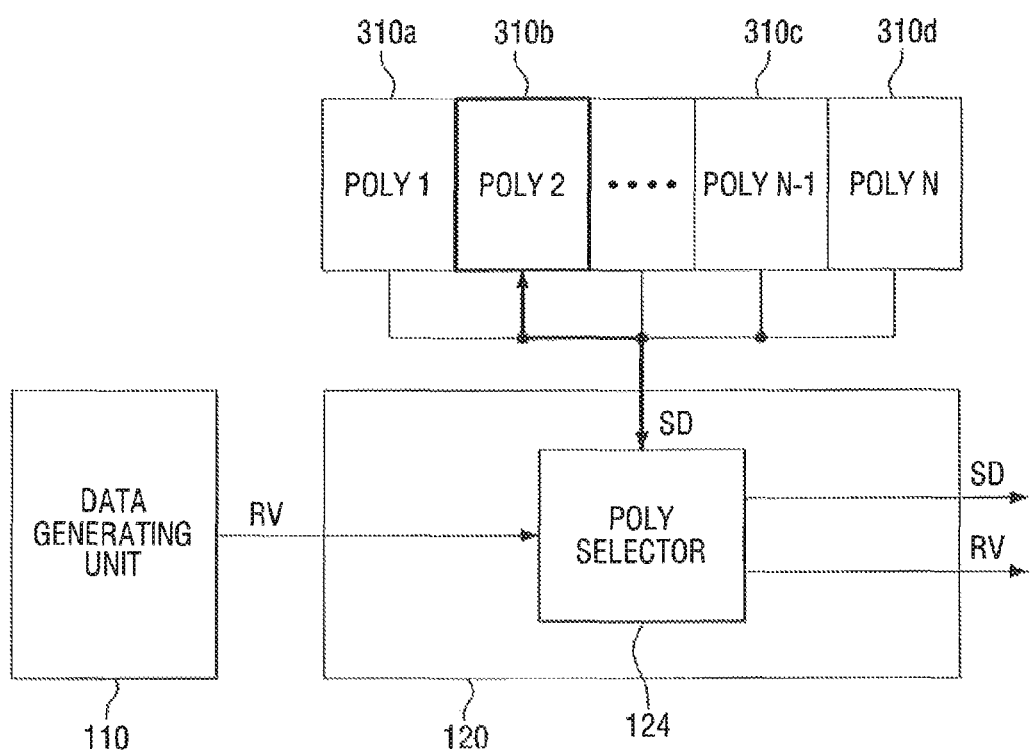
FIG. 8 is a block diagram of a nonvolatile memory device that selects a seed according to an exemplary embodiment of the present inventive concept.

FIG. 8 is a block diagram of a nonvolatile memory device that selects a seed according to an exemplary embodiment of the present inventive concept.

Referring to FIG. 8, the seed selecting unit 120 may select at least one of a plurality of polynomials 310a to 310d that are pre-stored using the reference value RV that is generated by the data generating unit 110, and may calculate the seed SD using the selected polynomial.

In exemplary embodiments of the present inventive concept, the plurality of polynomials 310a to 310d may be implemented as a circuit that is electrically connected to the nonvolatile memory device, but is not limited thereto. The seed selecting unit 120 may include a polynomial selector 124 for selecting the polynomial that corresponds to the reference value RV that is generated by the data generating unit 110 among the plurality of polynomials 310a to 310d. For example, the polynomial selector 124 may select the polynomial (e.g., polynomial 310b in FIG. 8) that corresponds to the reference value RV among the plurality of polynomials 310a to 310d, and may calculate the seed SD using the selected polynomial. The seed SD that is calculated using the selected polynomial as described above may be transferred to the randomizer 130 and may be used to randomize the data to be programmed in the memory cell 200.

Figure 9:
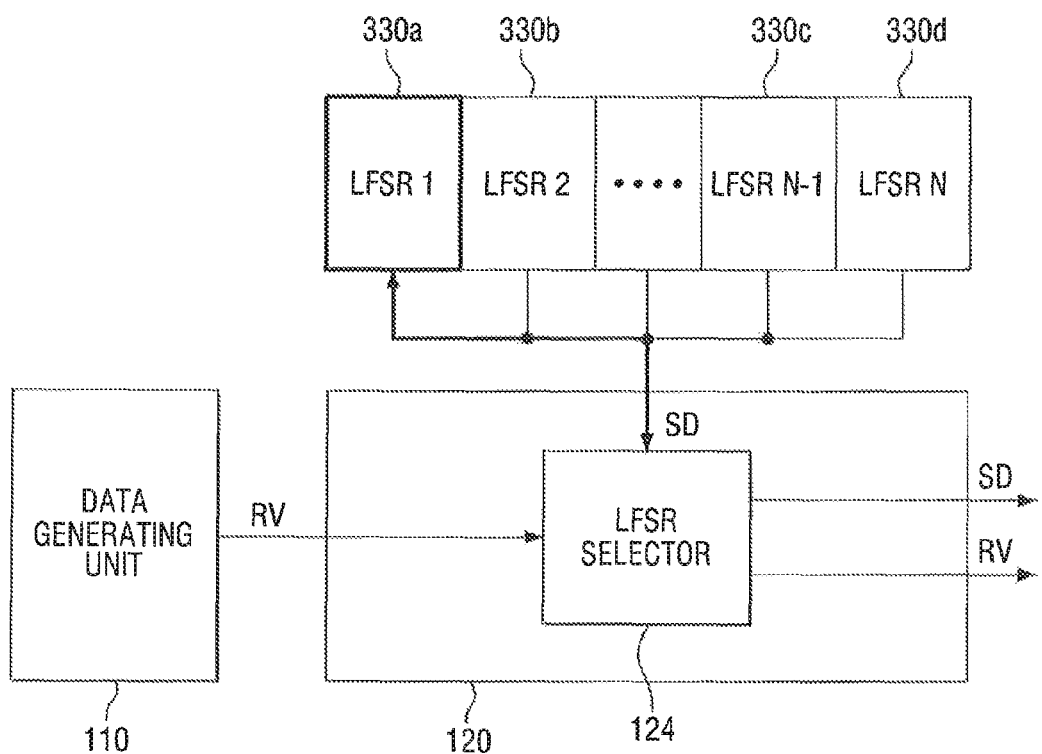
FIG. 9 is a block diagram of a nonvolatile memory device that selects a seed according to an exemplary embodiment of the present inventive concept.
Figure 10:
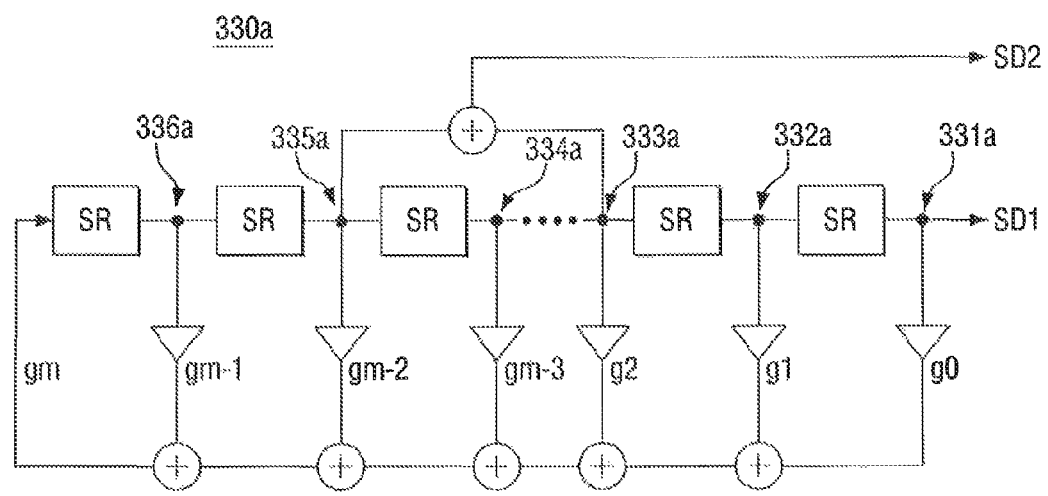
FIG. 10 is a block diagram of a nonvolatile memory device that selects a seed according to an exemplary embodiment of the present inventive concept.

FIG. 9 is a block diagram of a nonvolatile memory device that selects a seed according to an exemplary embodiment of the present inventive concept, and FIG. 10 is a diagram of a shift register that is used in FIG. 9, according to an exemplary embodiment of the present inventive concept.

Referring to FIG. 9, the seed selecting unit 120 may select at least one of a plurality of shift registers 330a to 330d that are pre-stored using the reference value RV that is generated by the data generating unit 110, and may calculate the seed using the selected shift register.

Referring to FIG. 10, in exemplary embodiments of the present inventive concept, each of the plurality of shift registers 330a to 330d may include a Linear Feedback Shift Register (LFSR) that is provided with m (where, m is an integer that is equal to or larger than 2) shift registers SR. For convenience in explanation, FIG. 10 illustrates a Fibonacci-implemented LFSR, but the implementation type of the LFSR is not limited thereto. In exemplary embodiments of the present inventive concept, the LFSR may include a Galois-implemented LFSR or a LFSR implemented in other various types. In exemplary embodiments of the present inventive concept, the plurality of shift registers 330a to 330d may be implemented as a circuit that is electrically connected to the nonvolatile memory device, but are not limited thereto.

The seed selecting unit 120 may include a LFSR selector 126 for selecting the shift register, e.g., the LFSR, which corresponds to the reference value RV that is generated by the data generating unit 110 among the plurality of shift registers 330a to 330d. For example, the LFSR selector 124 may select the shift register (e.g., shift register 330a in FIG. 9) that corresponds to the reference value RV among the plurality of shift registers 330a to 330d, and may calculate the seed SD using the selected shift register. The seed SD that is calculated using the selected shift register as described above may be transferred to the randomizer 130 and may be used to randomize the data to be programmed in the memory cell 200.

Referring again to FIG. 10, the nonvolatile memory device may generate a seed SD2 through combination of two or more output tap values. For example, the shift register 330a that is selected by the seed selecting unit 120 in FIG. 9 may include a plurality of output taps 331a to 336a. Here, the seed selecting unit 120 may calculate the seed SD2 by combining (e.g., XOR-gating) an output value of the output tap 333a and an output value of the output tap 335a among the plurality of output taps 331a to 336a of the shift register 330a. In other words, the seed selecting unit 120 may directly calculate the seed SD1 using the selected shift register 330a or may calculate the seed SD2 by combining output values that can be acquired from two or more output taps included in the shift register 330a. As shown in FIG. 10, the shift register 330 may include a plurality of SR latches SR and inverters, gm, gm-1, gm-2, gm-3, g2, g1 and g0.

The data that is randomized by various methods as described above with reference to FIGS. 6 to 10 may be programmed in the memory cell 200 together with the reference value RV that is generated by the data generating unit 110 or a value that corresponds to the reference value RV. Here, the value that corresponds to the reference value RV may be, for example, a table index value that corresponds to the reference value RV in the embodiment of FIG. 6, a polynomial index value that corresponds to the reference value RV in the embodiment of FIG. 8, or a LFSR index value that corresponds to the reference value RV in the embodiment of FIG. 9. In other words, the value that corresponds to the reference value RV is not the reference value RV itself, but includes additional information about the seed that is required to derandomize the randomized data to be programmed in the memory cell 200 later.

Figure 11:
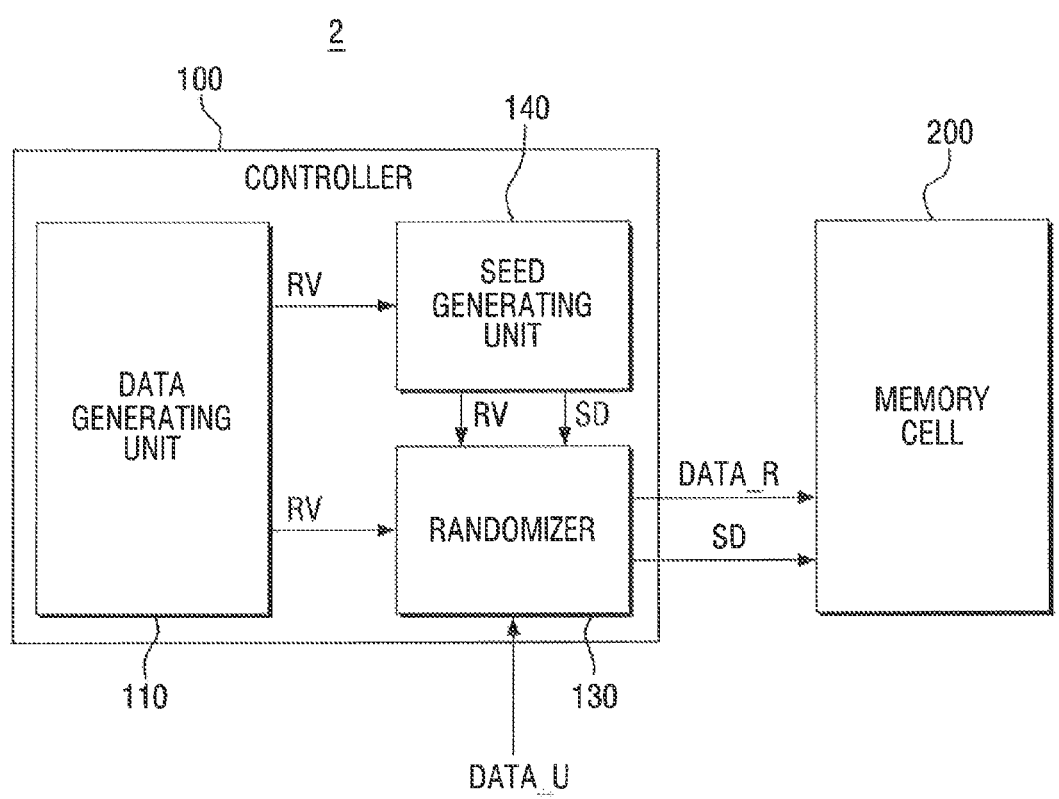
FIG. 11 is a block diagram of a nonvolatile memory device according to an exemplary embodiment of the present inventive concept.

FIG. 11 is a block diagram of a nonvolatile memory device according to an exemplary embodiment of the present inventive concept.

Referring to FIG. 11, a nonvolatile memory device 2 according to an exemplary embodiment of the present inventive concept is different from the nonvolatile memory device as described above with reference to FIG. 1 in that a controller 100 of the nonvolatile memory device 2 includes a seed generating unit 140. The seed generating unit 140 may be a circuit.

The seed selecting unit 120 of FIG. 1 selects at least one of the plurality of seeds SD that are pre-generated and stored using the reference value RV that is generated by the data generating unit 110, whereas the seed generating unit 140 in this embodiment generates two or more seeds in real time or on-the-fly using the reference value RV that is generated by the data generating unit 110. Accordingly, in this embodiment, a storage space in which pre-generated seeds are to be stored is not required. In exemplary embodiments of the present inventive concept, the seed generating unit 140 may regenerate the seed SD using the reference value RV that is regenerated by the data generating unit 110 when a program request is generated, and the regenerated seed SD may be different from the previously selected seed SD. The randomizer 130 randomizes the data using the seed SD that is generated by the seed generating unit 140 and generates randomized data DATA_R.

Figure 12:
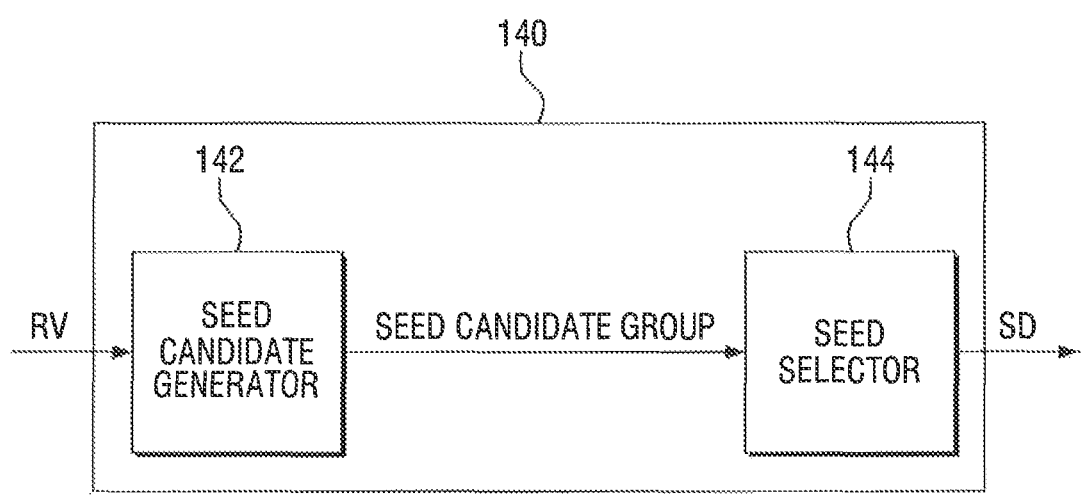
FIG. 12 is a block diagram of a seed generating unit of a nonvolatile memory device according to an exemplary embodiment of the present inventive concept.
Figure 13:
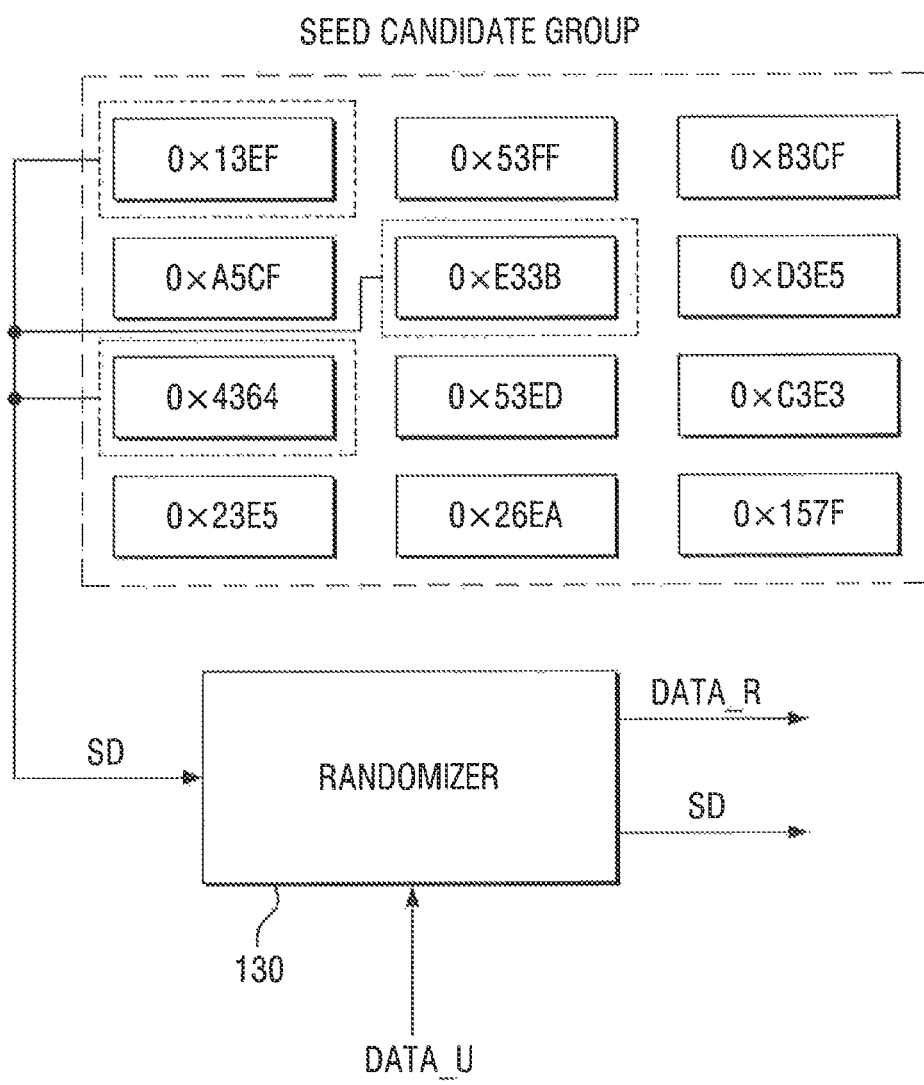
FIG. 13 is a schematic diagram of a nonvolatile memory device that selects a seed according to an exemplary embodiment of the present inventive concept.

FIG. 12 is a block diagram of a seed generating unit of a nonvolatile memory device according to an exemplary embodiment of the present inventive concept, and FIG. 13 is a schematic diagram of a nonvolatile memory device that selects a seed according to an exemplary embodiment of the present inventive concept.

Referring to FIG. 12, the seed generating unit 140 of the nonvolatile memory device 2 may include a seed candidate generator 142 and a seed selector 144. The seed candidate generator 142 may generate a seed candidate group that includes a plurality of seed candidates using the reference value RV that is generated by the data generating unit 110. Further, the seed selector 144 may select two or more seeds that satisfy a predetermined rule from the seed candidate group that is generated by the seed candidate generator 142. Here, the predetermined rule includes a condition in which all program states are uniformly output through one word line WL. For example, the cell program states of an N-bit Multi Level Cell (MLC) are determined by N seeds and input data, and in this case, the predetermined rule includes a limit condition in which the result of XOR-gating any two or more seeds among N seeds should not be "0".

For example, in the case of a 3-bit MLC, the result of XOR-gating at least two of three seeds A, B, and C should not be "0". In other words, the result of XOR-gating A and B, B and C, A and C, and A, B, and C should not be "0". In addition, in the case of a 4-bit MLC, the result of XOR-gating at least two of four seeds A, B, C, and D should not be "0". In other words, the result of XOR-gating A, B, and C; A, B, and D; A, C, and D; B, C, and D; and A, B, C, and D should not be "0" as the condition of the 3-bit MLC is included.

Referring to FIG. 13, the seed candidate generator 142 generates a seed candidate group that includes 12 seed candidates using the reference value RV that is generated by the data generation unit 110. Thereafter, the seed selector 144 selects the seeds SD "0x13EF", "0XE33b", and "0x4364" that satisfy, for example, the limit condition of the XOR gating as described above. Thereafter, the randomizer 130 randomizes the program-requested data DATA_U in the memory cell 200 using the seeds SD "0x13EF", "0XE33b", and "0x4364" that are selected by the seed selector 144, and generates randomized data DATA_R.

Thereafter, the randomized data DATA_R may be programmed in the memory cell 200 together with the two or more seeds SD that are generated by the seed generation unit 140. The randomized data that is programmed in the memory cell 200 may be derandomized using two or more seeds SD that are programmed together in the memory cell 200.

Figure 14:
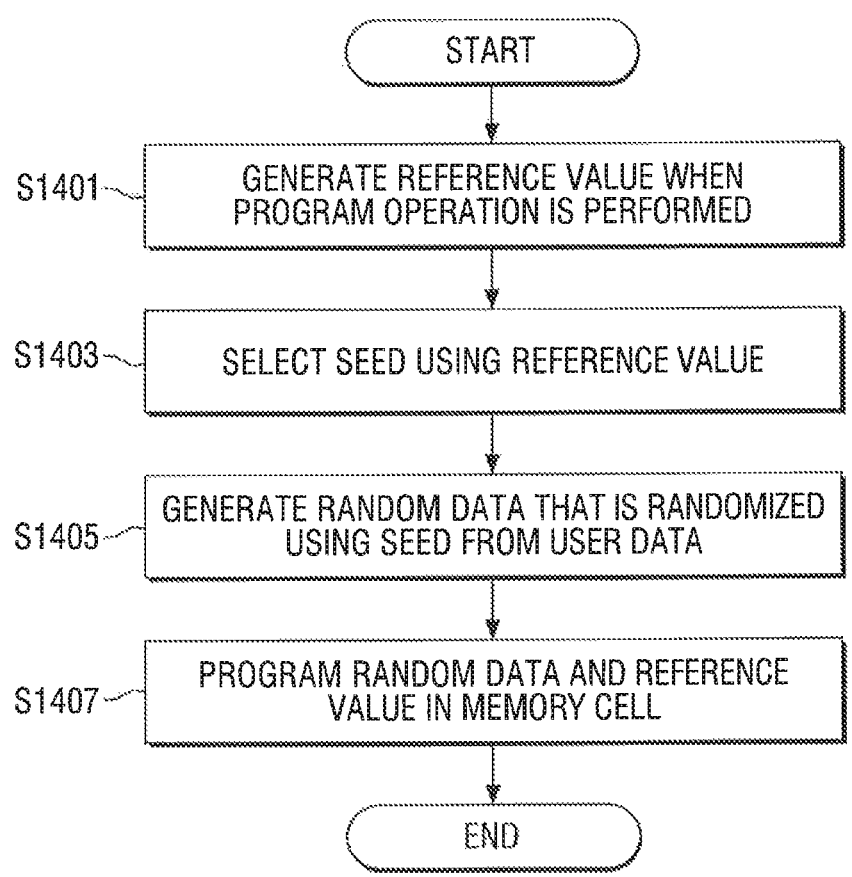
FIG. 14 is a flowchart of a method for operating a nonvolatile memory device according to an exemplary embodiment of the present inventive concept.

FIG. 14 is a flowchart of a method for operating a nonvolatile memory device according to an exemplary embodiment of the present inventive concept.

Referring to FIG. 14, a method for operating a nonvolatile memory device according to an exemplary embodiment of the present inventive concept may include the following steps.

First, a reference value RV is generated randomly or pseudo-randomly when a program operation of the nonvolatile memory device is performed (S1401). In exemplary embodiments of the present inventive concept, the above-described steps may include generating the reference value RV randomly or pseudo-randomly according to a program request for programming data in a memory cell 200. In exemplary embodiments of the present inventive concept, the generating the reference value RV according to the program request may include generating the reference value RV as a different value when the program request is made.

Next, at least one of a plurality of seeds SD is selected using the reference value RV (S1403). In exemplary embodiments of the present inventive concept, the selecting at least one of the plurality of seeds SD using the reference value RV may include selecting a seed SD that corresponds to the reference value RV among the pre-stored seed values.

Thereafter, random data DATA_R that is randomized from user data DATA_U is generated using the selected seed SD (S1405), and the generated random data DATA_R is programmed in the memory cell 200 (S1407). In exemplary embodiments of the present inventive concept, the programming the random data DATA_R in the memory cell 200 may include programming the reference value RV that is generated by the data generating unit 110 or a value that corresponds to the reference value RV in the memory cell 200 together with the random data DATA_R.

Figure 15:
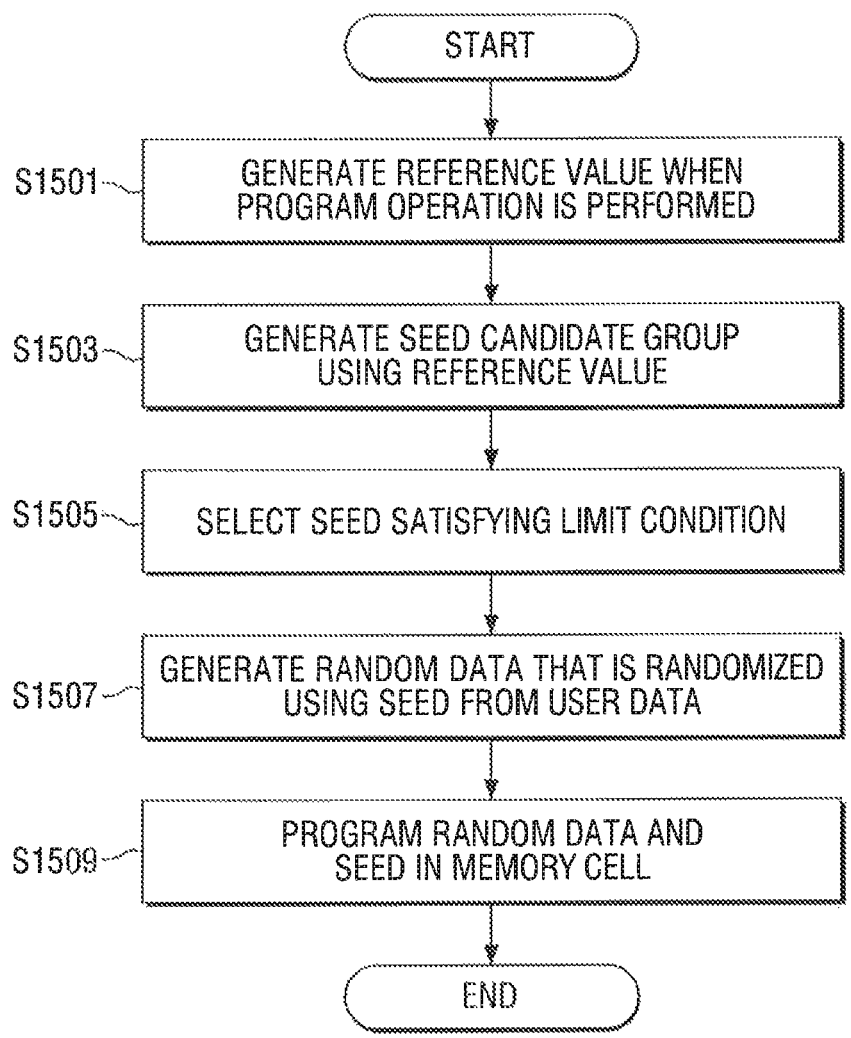
FIG. 15 is a flowchart of a method for operating a nonvolatile memory device according to an exemplary embodiment of the present inventive concept.

FIG. 15 is a flowchart of a method for operating a nonvolatile memory device according to an exemplary embodiment of the present inventive concept.

Referring to FIG. 15, a method for operating a nonvolatile memory device according to an exemplary embodiment of the present inventive concept may include the following steps.

First, a reference value RV is generated randomly or pseudo-randomly when a program operation of the nonvolatile memory device is performed (S1501). In exemplary embodiments of the present inventive concept, the above-described steps may include generating the reference value RV randomly or pseudo-randomly according to a program request for programming data in a memory cell 200. In exemplary embodiments of the present inventive concept, the generating the reference value RV according to the program request may include generating the reference value RV as a different value when the program request is made.

Next, to select at least one of a plurality of seeds SD using the reference value RV, a seed candidate group that includes a plurality of seed candidates is generated using the reference value RV according to the program request (S1503). Then, two or more seeds SD that satisfy a predetermined limit condition among the plurality of seed candidates in the generated seed candidate group are selected (S1505).

Thereafter, random data DATA_R that is randomized from user data DATA_U is generated using the selected seed SD (S1507), and the generated random data DATA_R is programmed in the memory cell 200 (S1509). In exemplary embodiments of the present inventive concept, the programming the random data DATA_R in the memory cell 200 may include programming the two or more seeds that are generated by the seed generating unit 140 in the memory cell 200 together with the random data DATA_R.

The nonvolatile memory device and the method for operating the nonvolatile memory device according to exemplary embodiments of the present inventive concept may increase randomness of the randomized data to be programmed in the memory cell 200 such that errors may not occur between adjacent cells. For example, in the nonvolatile memory device and the method for operating the nonvolatile memory device according to exemplary embodiments of the present inventive concept, since the seed SD is selected using a specific value (e.g., a reference value) that is changed randomly in time, the seed SD itself has randomness over time, and thus, the randomness of the randomized data using the seed SD becomes further increased. Accordingly, as described above with reference to FIG. 1, the deep erase phenomenon or abrasion phenomenon of a specific memory cell can be suppressed, and thus, reliability of the nonvolatile memory device can be increased.

The nonvolatile memory device and the method for operating the nonvolatile memory device according to exemplary embodiments of the present inventive concept as described above can be applied to not only a planar NAND flash memory but also a vertical NAND flash memory. In the case of the vertical NAND flash memory, the memory block BLKi as described above with reference to FIG. 1 may have a 3D structure (or vertical structure) as illustrated in FIG. 16.

Figure 16:
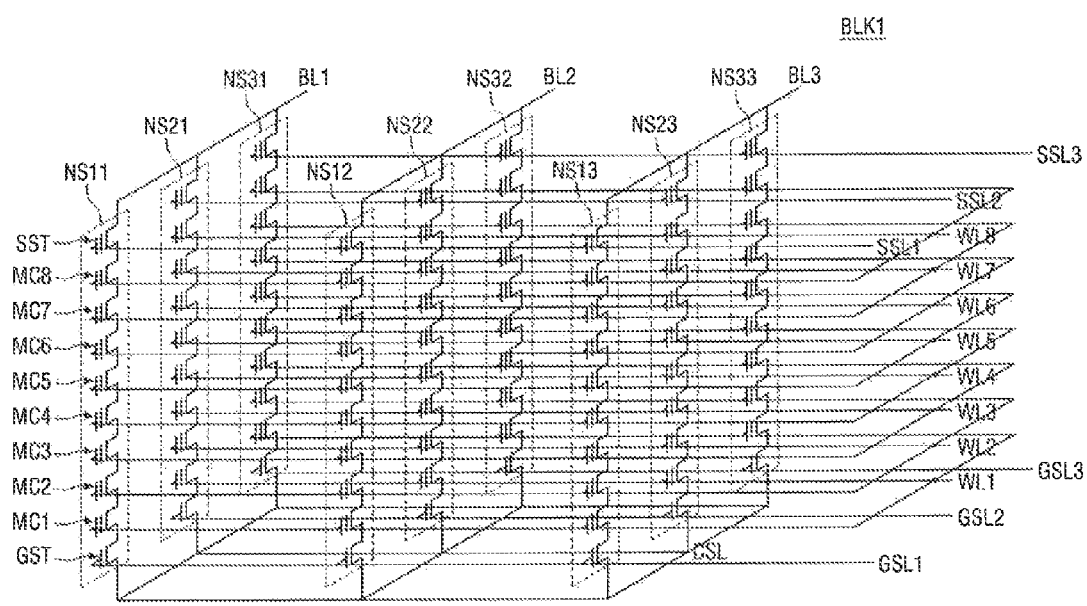
FIG. 16 is a circuit diagram of an equivalent circuit of a memory block explained with reference to FIG. 1, according to an exemplary embodiment of the present inventive concept.

FIG. 16 is a circuit diagram of an equivalent circuit of a memory block BLKi explained with reference to FIG. 1, according to an exemplary embodiment of the present inventive concept. Referring to FIG. 16, NAND strings NS11 to NS31 are provided between a first bit line BL1 and a common source line CSL, and NAND strings NS12, NS22, and NS32 are provided between a second bit line BL2 and the common source line CSL. Further, NAND strings NS13, NS23, and NS33 are provided between a third bit line BL3 and the common source line CSL. String selection transistors SST of the respective NAND strings NS are connected to corresponding bit lines BL. Ground selection transistors GST of the respective NAND strings NS are connected to the common source line CSL. Memory cells MC are provided between the string selection transistors SST and the ground selection transistors GST of the respective NAND strings NS. For example, memory cells MC1 to MC8 are provided.

String selection lines SSL1 to SSL3 are connected to the string selection transistors SST of the respective NAND strings NS, word lines WL1 to WL8 are connected to the memory cells MC1 to MC8 and ground selection lines GSL1 to GSL3 are connected to the ground selection transistors GST of the respective NAND strings NS.

Figure 17:
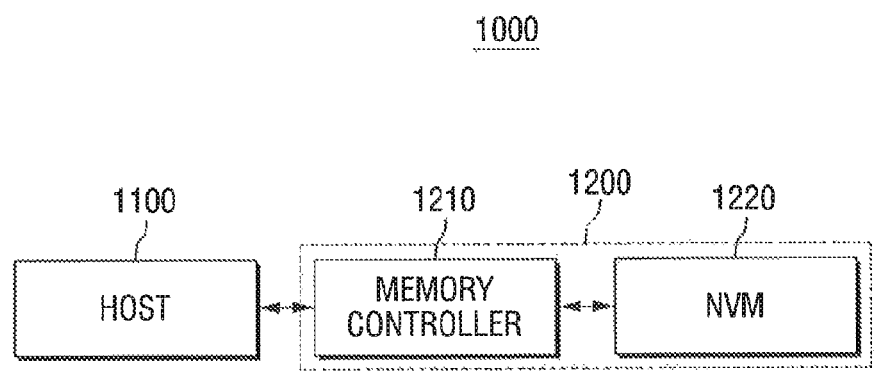
FIG. 17 is a block diagram of a user device that includes a nonvolatile memory device according to exemplary embodiments of the present inventive concept.

FIG. 17 is a block diagram of a user device that includes a nonvolatile memory device according to exemplary embodiments of the present inventive concept.

Referring to FIG. 17, a user device 1000 may include a host 1100 and a data storage device 1200.

The host 1100 may be configured to control the data storage device 1200. For example, the host 1100 may include a portable electronic device, such as a personal/portable computer, a Personal Digital Assistant (PDA), a Portable Media Player (PMP), or an MP3 player.

The host 1100 and the data storage device 1200 may be connected to each other by a standardized interface, such as Universal Serial Bus (USB), Small Computer System Interface (SCSI), Enhanced Small Disk Interface (ESDI), Serial Advanced Technology Attachment (SATA), Serial Attached SCSI (SAS), Peripheral Component Interconnected (PCI) express, or Integrated Drive Electronics (IDE) interface. However, the interface method for connecting the host 1100 and the data storage device 1200 to each other is not limited thereto.

The data storage device 1200 may include a memory controller 1210 and a nonvolatile memory device 1220. The memory controller 1210 may control write/read/erase operations of the nonvolatile memory device 1220 in response to a request from the host 1100.

The nonvolatile memory device 1220 may be composed of a plurality of nonvolatile memory chips. The plurality of nonvolatile memory chips may be configured and operated substantially in the same manner as a nonvolatile memory device according to exemplary embodiments of the present inventive concept.

The data storage device 1200 may be composed of a Solid State Disk (SSD). However, this is merely exemplary, and the data storage device 1200 may be integrated into one semiconductor device, and may be composed of a Personal Computer Memory Card International Association (PCMC1A) card, a Compact Flash (CF) card, a smart media card (SM, SMC), a memory stick, a multimedia card (MMC, reduced size (RS)-MMC, MMC-micro), a secure digital card (SD, miniSD, microSD, secure digital high capacity (SDHC)), or a Universal Flash Storage (UFS).

Figure 18:
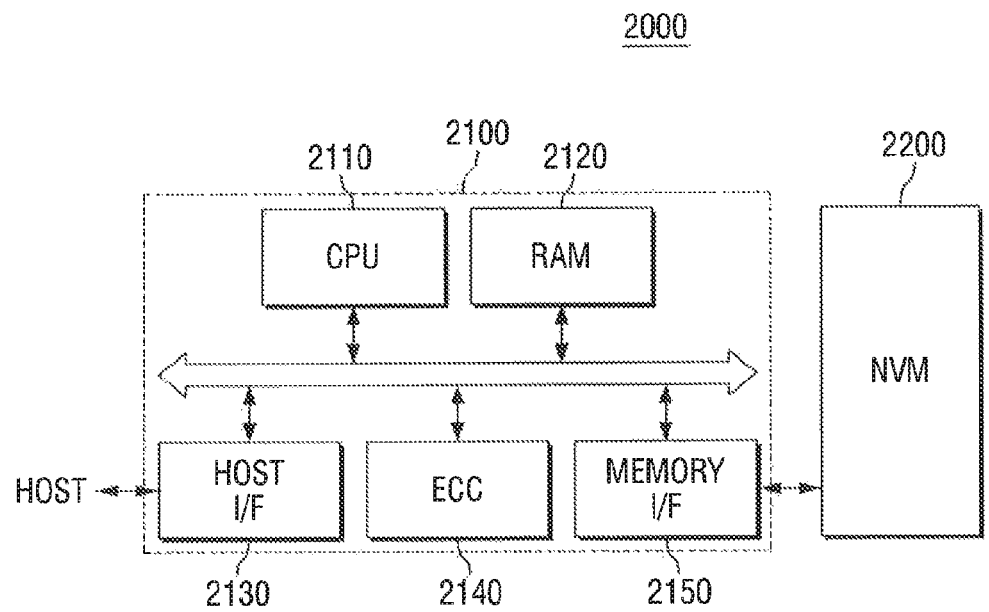
FIG. 18 is a block diagram of an application example of a memory system that includes a nonvolatile memory device according to exemplary embodiments of the present inventive concept.

FIG. 18 is a block diagram of an application example of a memory system that includes a nonvolatile memory device according to exemplary embodiments of the present inventive concept.

Referring to FIG. 18, a memory system 2000 may include a memory controller 2100 and a nonvolatile memory device 2200.

The memory controller 2100 may control write/read/erase operations of the nonvolatile memory device 2200 in response to a request from a host. The memory controller 2100 may include a central processing unit (CPU) 2110, a RAM 2120, a host interface 2130, an error correction block 2140, and a memory interface 2150.

The CPU 2110 may control the operation of the memory controller 2100. The RAM 2120 may be used as a working memory of the CPU 2110. The host interface 2130 may exchange data through interfacing with the host that is connected to the memory system 2000.

The error correction block 2140 may detect and correct errors of data read from the nonvolatile memory device 2200. The memory interface 2150 may interface with the nonvolatile memory device 2200 to exchange data.

The nonvolatile memory device 2200 may be composed of a plurality of nonvolatile memory chips. The plurality of nonvolatile memory chips may be configured and operated substantially in the same manner as a nonvolatile memory device according to exemplary embodiments of the present inventive concept.

Figure 19:
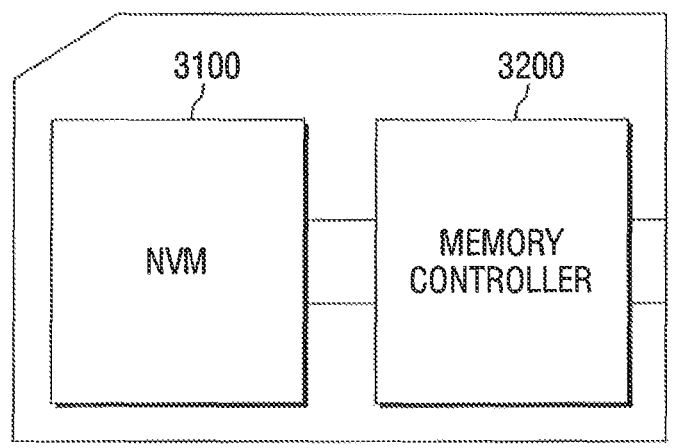
FIG. 19 is a block diagram of a data storage device that includes a nonvolatile memory device according to exemplary embodiments of the present inventive concept.

FIG. 19 is a block diagram of a data storage device that includes a nonvolatile memory device according to exemplary embodiments of the present inventive concept.

Referring to FIG. 19, a data storage device 3000 may include a nonvolatile memory device 3100 and a memory controller 3200.

The nonvolatile memory device 3100 may be composed of a plurality of nonvolatile memory chips. The plurality of nonvolatile memory chips may be configured and operated substantially in the same manner as a nonvolatile memory device according to exemplary embodiments of the present inventive concept.

The memory controller 3200 may control write/read/erase operations of the nonvolatile memory device 3100 in response to a request from outside the data storage device 3000.

The data storage device 3000 may be composed of a memory card device, a SSD device, a multimedia card device, a SD device, a memory stick device, a hard disk drive, a hybrid drive, or a general serial bus flash device. For example, the data storage device 3000 may constitute a card for using a user device, such as a digital camera or a personal computer.

Figure 20:
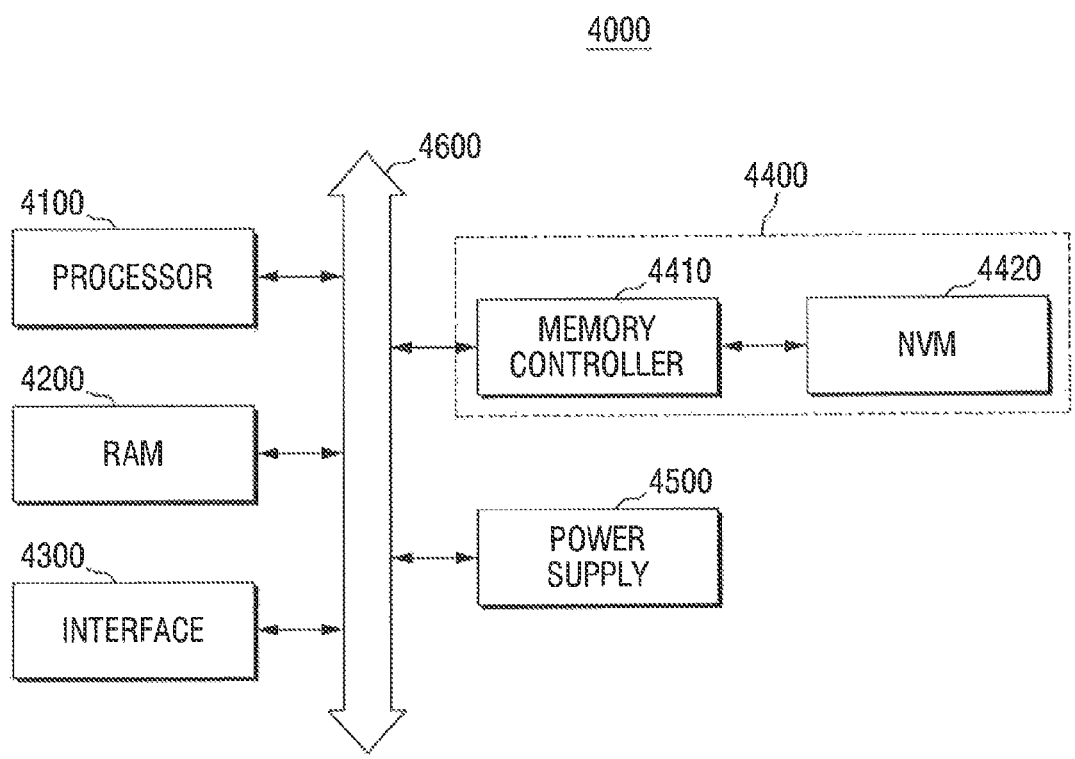
FIG. 20 is a block diagram of a computing system that includes a nonvolatile memory device according to exemplary embodiments of the present inventive concept.

FIG. 20 is a block diagram of a computing system that includes a nonvolatile memory device according to exemplary embodiments of the present inventive concept.

Referring to FIG. 20, a computer system 4000 may include a processor 4100, a RAM 4200, an interface device 4300, a memory system 4400, a power supply 4500, and a bus 4600.

The processor 4100, the RAM 4200, the interface device 4300, the memory system 4400, and the power supply 4500 may be coupled to each other through the bus 4600. The bus 4600 corresponds to a path through which data moves.

The processor 4100 may include at least one of a microprocessor, a digital signal processor, a microcontroller, and logic devices that perform similar functions.

The RAM 4200 may be used as a working memory to increase the performance of the processor 4100. The interface device 4300 may transmit data to a communication network or may receive data from the communication network.

The interface device 4300 may be in a wired or wireless form. For example, the interface device 4300 may include an antenna or a wire/wireless transceiver.

The memory system 4400 may store data and/or commands. The memory system 4400 may include a memory controller 4410 and a nonvolatile memory device 4420.

The memory controller 4410 may control the write/read/erase operations of the nonvolatile memory device 4420. The nonvolatile memory device 4420 may be composed of a plurality of nonvolatile memory chips. The plurality of nonvolatile memory chips may be configured and operated substantially in the same manner as a nonvolatile memory device according to exemplary embodiments of the present inventive concept.

The power supply 4500 may supply the operating power of the processor 4100, the RAM 4200, the interface device 4300, and the memory system 4400.

The computing system 4000 may be applied to a PDA, a portable computer, a web tablet, a wireless phone, a mobile phone, a digital music player, a memory card, or all electronic products that can transmit and/or receive information in wireless communication environments.

Although exemplary embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A memory system, comprising:
a vertical NAND memory, comprising a plurality of memory blocks, each of the memory blocks comprises a plurality of memory cells, wherein the memory blocks have three-dimensional (3D) structure in which the memory cells are stacked on a substrate in a vertical direction; and
a memory controller coupled to the vertical NAND memory, comprising:
a data generating unit for generating a first reference value randomly or pseudo-randomly according to a first program request to program data in the memory cell;
a seed selecting unit for selecting at least one of a plurality of seeds using the first reference value; and
a randomizer for generating randomized data by using the selected seed,
wherein the data generating unit generates a second reference value different from the first reference value when a second program request is made, and
the seed selecting unit selects another seed using the second reference value.

2. The memory system of claim 1, wherein the randomizer randomizes the data using the another seed when the second program request is made.

3. The memory system of claim 1, wherein the data generating unit comprises a timer, a True Random Number Generator (TRNG), a counter, or a shift register.

4. The memory system of claim 3, wherein the data generating unit generates the first reference value using the timer, for the first reference value to have randomness based on a real time clock (RTC) of the memory system in which the vertical NAND memory is disposed.

5. The memory system of claim 1, wherein the plurality of seeds are stored in a plurality of seed tables, and
the seed selecting unit selects the seed table that corresponds to the first reference value among the plurality of seed tables, and selects the seed from the selected seed table.

6. The memory system of claim 5, wherein each of the plurality of seed tables includes table index values identifying the respective seed tables, and
the first reference value corresponds to one of the table index values.

7. The memory system of claim 1, wherein the plurality of seeds are calculated from a plurality of polynomials, and the seed selecting unit selects the polynomial that corresponds to the first reference value among the plurality of polynomials, and calculates the seed using the selected polynomial.

8. The memory system of claim 1, wherein the plurality of seeds are respectively calculated by a plurality of shift registers, and
the seed selecting unit selects the shift register that corresponds to the first reference value among the plurality of shift registers, and calculates the seed using the selected shift register.

9. The memory system of claim 8, wherein the selected shift register comprises a first output tap and a second output tap, and
the seed selecting unit calculates the seed by combining an output value of the first output tap with an output value of the second output tap of the selected shift register.

10. The memory system of claim 1, wherein the randomized data is programmed in the memory cell together with the first reference value or a value that corresponds to the first reference value.

11. The memory system of claim 1, wherein the seed generating unit generates two or more seeds using the first reference value, and the randomizer generates randomized data by using the two or more seeds.

12. The memory system of claim 11, wherein the seed generating unit comprises:
a seed candidate generator for generating a seed candidate group including a plurality of seed candidates using the first reference value; and
a seed selector for selecting two or more seeds that satisfy a predetermined rule from the seed candidate group generated by the seed candidate generator.

13. The memory system of claim 1, wherein the vertical NAND memory comprises a plurality of NAND strings disposed in a vertical direction, and each of NAND strings are provided between a bit line (BL) and a common source line (CSL) which are formed in horizontal direction,
wherein each of NAND strings comprises a gate selection transistor (GST), a string selection transistor (SST) and a plurality of memory cells between the GST and the SST, and
wherein the vertical NAND memory further comprises a string selection line (SSL) connected to the SST, a plurality of word lines (WL) connected to the plurality of memory cells, and a ground selection line (GSL) connected to the GST.

14. The memory system of claim 1, wherein the memory cell includes Charge Trap Flash (CTF) type memory cell.

15. A storage device, comprising:
a flash memory comprising of a plurality of memory cells; and
a storage device controller coupled to the flash memory, comprising:
a data generating unit for generating a reference value randomly or pseudo-randomly each time a program request to program data in a memory cell is made; and
a randomizer for selecting a seed that corresponds to the reference value among pre-stored seeds, and generating randomized data that is obtained by randomizing the data each time the program request is made,
wherein the randomized data is programmed in the memory cell, and the data generating unit regenerates the reference value as a different value each time the program request is made.

16. The storage device of claim 15, wherein the storage device includes a Solid State Disk (SSD).

17. The storage device of claim 15, wherein the data generating unit generates the reference value using a value that is acquired from a timer, a True Random Number Generator (TRNG), a counter, or a shift register.

18. The storage device of claim 17, wherein the storage device is electrically connected to a volatile memory device that is arranged on an outside of the storage device, and
an initial value of the counter is set using an initial value that is stored in the volatile memory device during power-on of the volatile memory device.

19. The storage device of claim 15, wherein the pre-stored seeds are stored in a ROM (Read Only Memory) that is electrically connected to the storage device.

20. A nonvolatile memory system, comprising:
a nonvolatile memory comprising a plurality of memory cells; and
a memory controller coupled to the nonvolatile memory, comprising:
a data generating unit for generating a first reference value randomly or pseudo-randomly according to a first program request to program data in a memory cell;
a seed selecting unit for selecting at least one of a plurality of seeds using the first reference value; and
a randomizer for generating randomized data by using the selected seed,
wherein the data generating unit generates a second reference value different from the first reference value when a second program request is made, and
the seed selecting unit selects another seed using the second reference value.

21. The nonvolatile memory system of claim 20, wherein the randomizer randomizes the data using the another seed when the second program request is made.

22. The nonvolatile memory system of claim 20, wherein the plurality of seeds are stored in a plurality of seed tables, and
the seed selecting unit selects the seed table that corresponds to the first reference value among the plurality of seed tables, and selects the seed from the selected seed table.

23. The nonvolatile memory system of claim 20, wherein the plurality of seeds are calculated from a plurality of polynomials, and
the seed selecting unit selects the polynomial that corresponds to the first reference value among the plurality of polynomials, and calculates the seed using the selected polynomial.

24. The nonvolatile memory system of claim 20, wherein the plurality of seeds are respectively calculated by a plurality of shift registers, and
the seed selecting unit selects the shift register that corresponds to the first reference value among the plurality of shift registers, and calculates the seed using the selected shift register.

25. The nonvolatile memory system of claim 20, wherein the randomized data is programmed in the memory cell together with the first reference value or a value that corresponds to the first reference value.

26. The nonvolatile memory system of claim 20, wherein the seed generating unit generates two or more seeds using the first reference value, and the randomizer generates randomized data by using the two or more seeds.

27. A method of operating a nonvolatile memory device, comprising:
generating, using a memory controller coupled to the nonvolatile memory device, a first reference value randomly or pseudo-randomly according to a first program request to program data in a memory cell of the nonvolatile memory device;

selecting, using the memory controller, at least one of a plurality of seeds using the first reference value;

generating, using the memory controller, randomized data by using the selected seed;

generating, using the memory controller, a second reference value different from the first reference value when a second program request is made; and selecting, using the memory controller, another seed using the second reference value, wherein the nonvolatile memory device includes a vertical NAND memory including a plurality of memory blocks, each of the memory blocks including a plurality of memory cells, wherein the memory blocks have a three-dimensional (3D) structure in which the memory cells are stacked on a substrate in a vertical direction.

28. The method of claim 27, wherein the selecting at least one of a plurality of seeds using the first reference value comprises selecting a seed that corresponds to the reference value among pre-stored seed values.

29. The method of claim 28, wherein the selecting at least one of a plurality of seeds using the first reference value comprises:

generating a plurality of seed candidates using the reference value; and selecting two or more seeds that satisfy a predetermined rule from the plurality of seed candidates.

30. The method of claim 28, further comprising programming the first reference value or the selected seed in the memory cell together with the random data.

* * * * *